United States Patent [19]
Figura et al.

[11] Patent Number: 5,763,286
[45] Date of Patent: Jun. 9, 1998

[54] PROCESS FOR MANUFACTURING A DRAM CAPACITOR HAVING AN ANNULARLY-GROOVED, CUP-SHAPED STORAGE-NODE PLATE WHICH STORES CHARGE ON INNER AND OUTER SURFACES

[75] Inventors: Thomas A. Figura; Angus C. Fox, III, both of Boise, Id.

[73] Assignee: Micron Semiconductor, Inc., Boise, Id.

[21] Appl. No.: 533,690

[22] Filed: Sep. 26, 1995

Related U.S. Application Data

[62] Division of Ser. No. 306,228, Sep. 14, 1994, abandoned.

[51] Int. Cl.⁶ .................................................. H01L 21/8242
[52] U.S. Cl. ............................... 437/60; 437/919; 437/977
[58] Field of Search ........................... 437/47, 60, 919, 437/977, 978; 148/DIG. 14, DIG. 138

[56] References Cited

U.S. PATENT DOCUMENTS

| | | | |
|---|---|---|---|
| 5,170,233 | 12/1992 | Liu et al. | 257/308 |
| 5,185,282 | 2/1993 | Lee et al. | 437/47 |
| 5,206,787 | 4/1993 | Fujioka | 257/307 |
| 5,227,322 | 7/1993 | Ko et al. | 437/60 |
| 5,240,871 | 8/1993 | Doan et al. | 437/47 |
| 5,350,707 | 9/1994 | Ko et al. | 437/60 |

FOREIGN PATENT DOCUMENTS

| | | |
|---|---|---|
| 557590-A1 | 9/1993 | European Pat. Off. . |
| 4-69964 A | 3/1992 | Japan . |
| 5-129548 A | 5/1993 | Japan . |
| 5-315566 A | 11/1993 | Japan . |

OTHER PUBLICATIONS

Woo, et al., "Selective Etching Technology in in-situ P Doped Poly-Si (SEDOP) for High Density DRAM Capacitors", 1994 Symposium on VLSI Technology Digest of Technical Papers, pp. 25–26.

Primary Examiner—Chandra Chaudhari
Attorney, Agent, or Firm—Holland & Hart; Angus C. Fox, III

[57] ABSTRACT

This invention is a process for fabricating a DRAM capacitor having an annularly-grooved, cup-shaped storage-node plate and a cell plate which covers both inner and outer surfaces of the storage-node plate. A plurality of oxide layers having alternately-varying composition are deposited on top of an in-process DRAM array to form a single sacrificial mold layer. In a preferred embodiment of the invention, ozone TEOS oxide is one of the alternately-varying layers, and plasma-enhanced TEOS oxide is the other. Ozone TEOS oxide etches more rapidly than does plasma-enhanced TEOS oxide, and both types of TEOS oxide are etchable with respect to polycrystalline silicon. Following the deposition of the sacrificial mold layer, the mold layer is patterned and anisotropically etched to form a mold opening in the mold layer. Contact to the storage node of the cell access transistor is made at the bottom of the mold opening. The mold layer is then subjected to a wet etch which etches the alternating oxide layers within the mold layer at different rates. Because of the different etch rates, a plurality of grooves are formed on the surface of the mold opening. A polysilicon layer is then deposited which covers the upper surface of the mold layer and conformally lines the mold opening. Following the removal of the polysilicon layer from the upper surface of the mold layer, the mold layer is etched away so as to expose the outer surface of the polysilicon layer remnant that is to be the storage-node capacitor plate. The capacitor is then completed in a conventional manner.

20 Claims, 8 Drawing Sheets

PROCESS FOR MANUFACTURING A DRAM CAPACITOR HAVING AN ANNULARLY-GROOVED, CUP-SHAPED STORAGE-NODE PLATE WHICH STORES CHARGE ON INNER AND OUTER SURFACES

This is a Divisional of application Ser. No. 08/306,228 filed on Sep. 14, 1994 and now abandoned.

FIELD OF THE INVENTION

This invention relates to integrated circuit manufacturing technology and, more specifically, to a low-cost process for manufacturing a dynamic random access memory capacitor having an annularly-grooved, cup-shaped storage-node plate which stores charge on inner and outer surfaces.

BACKGROUND OF THE INVENTION

The business of producing dynamic random access memory (DRAM) devices is a very competitive, high-volume business. Process efficiency and manufacturability, as well as product quality, reliability, and performance are the key factors that determine the economic success of such a venture.

Each cell within a DRAM device, an individually-addressable location for storing a single bit of digital data, is comprised of two main components: a field-effect access transistor and a capacitor. Each new generation of DRAM devices generally has an integration level that is four times that of the generation which it replaced. Such a quadrupling of device number per chip is always accompanied by a decrease in device geometries, and often by a decrease in operating voltages. As device geometries and operating voltages are decreased, the DRAM designer is faced with the difficult task of maintaining cell capacitance at an acceptable level. This must be accomplished without resorting to processes that reduce product yield or that markedly increase the number of masking and deposition steps in the production process. All DRAM memories of 4-megabit and greater density utilize cell designs having three-dimensional capacitors. Although both trench and stacked capacitor designs have proven serviceable at the 4-megabit level, most manufacturers now seem to favor the stacked capacitor design for its manufacturability and somewhat higher yield.

A number of stacked capacitor designs of varying complexity have been proposed by the various DRAM manufacturers. Typically, capacitor designs for the 64-megabit DRAM generation and beyond have been very complex and process intensive. A simpler, more easily manufacturable capacitor is needed.

SUMMARY OF THE INVENTION

This invention is a process for fabricating a DRAM capacitor having an annularly-grooved, cup-shaped storage-node plate and a cell plate which covers both inner and outer surfaces of the storage-node plate.

The process begins following wordline formation and source/drain implants. A base dielectric layer is deposited so as to cover the wordlines and field isolation regions within the cell array. In a preferred embodiment of the invention, the base dielectric layer is a flowable layer such as boro-phoso-silicate glass which provides a surface on which to construct cell capacitors. In one embodiment of the invention, storage-node contact openings and bitline contact openings are etched through the base dielectric layer in order to expose the storage-node junctions and access-node junctions, respectively. Both types of contact openings are then filled with conductive material and the array is planarized to leave conductive plugs in the contact openings. An optional etch-stop layer is then deposited such that it covers the upper surface of the base dielectric layer and the tops of the conductive plugs. In another embodiment of the invention, the base dielectric layer is planarized, and an etch-stop layer is deposited on top of the base dielectric layer prior to contact opening formation.

A plurality of alternating layers of first and second materials are deposited on top of the array. Taken together, the alternating layers constitute a single sacrificial mold layer which covers the upper surface of the etch stop layer. The second material is selectively etchable with respect to the first material, and both the first and the second materials are selectively etchable with respect to polycrystalline silicon (also referred to herein as "polysilicon"). In a preferred embodiment of the invention, a plurality of oxide layers having alternately-varying composition are deposited using tetra-ethyl-ortho silicate (TEOS) as a precursor compound in a chemical vapor deposition process. Oxide deposited using this precursor is commonly referred to as TEOS oxide. In one embodiment of the invention, alternating layers of ozone TEOS oxide (an oxide of silicon deposited using TEOS as a precursor in an ozone ambient) and plasma-enhanced TEOS oxide are deposited in-situ (i.e., in the same deposition reactor system by alternately varying the reactants admitted to the reactor). In another embodiment of the invention, alternating layers of doped and undoped TEOS oxide are deposited. In yet another embodiment, alternating layers of BPSG and undoped silicate glass (USG) are deposited. In still another embodiment, alternating layers of boron-doped and phosphorus-doped silicate glass are deposited. In the first case, ozone TEOS oxide etches more rapidly than does plasma-enhanced TEOS oxide. In the second and third case, doped TEOS oxide and BPSG etch more rapidly than do the undoped varieties of the same materials. In the fourth case, boron-doped silicate glass etches more rapidly than does phosphorus-doped silicate glass. Any of the aforementioned oxides (or glasses) can be wet etched with respect to polycrystalline silicon.

Following the deposition of the sacrificial mold layer, the mold layer is patterned (i.e., masked) and anisotropically etched to form a mold opening in the mold layer which extends through the etch stop layer to at least the upper surface of each storage-node contact plug. In a preferred embodiment of the invention, the mold openings are more or less cylindrical in shape, as such a shape (which reflects the shape of the subsequently-fabricated storage-node plates) provides efficient packing of array capacitors. The array is then subjected to a wet etch which etches the alternating oxide layers within the mold layer at different rates. Because of the different etch rates, a plurality of annular grooves are formed on the surface of the mold opening.

A polycrystalline silicon layer is then deposited on the upper surface of the mold layer and on the surfaces within the mold openings. In order to form individual storage node capacitor plates, that portion of the polycrystalline silicon layer that is, on the upper surface of the mold layer is removed. This may be accomplished in a number of ways without the use of an additional mask. Two preferred ways are with a chemical-mechanical polishing step or with a resist coating followed by a plasma etch.

In order to maximize surface area of each storage-node plate, the remaining portions of the mold layer are etched away with a single wet or dry etch step. The capacitor fabrication process is completed with the deposition of a capacitor dielectric layer (which completely covers all exposed portions of each storage-node capacitor plate) and the deposition of a cell plate layer on top of the capacitor dielectric layer.

PREFERRED EMBODIMENT OF THE INVENTION

Figure 1:
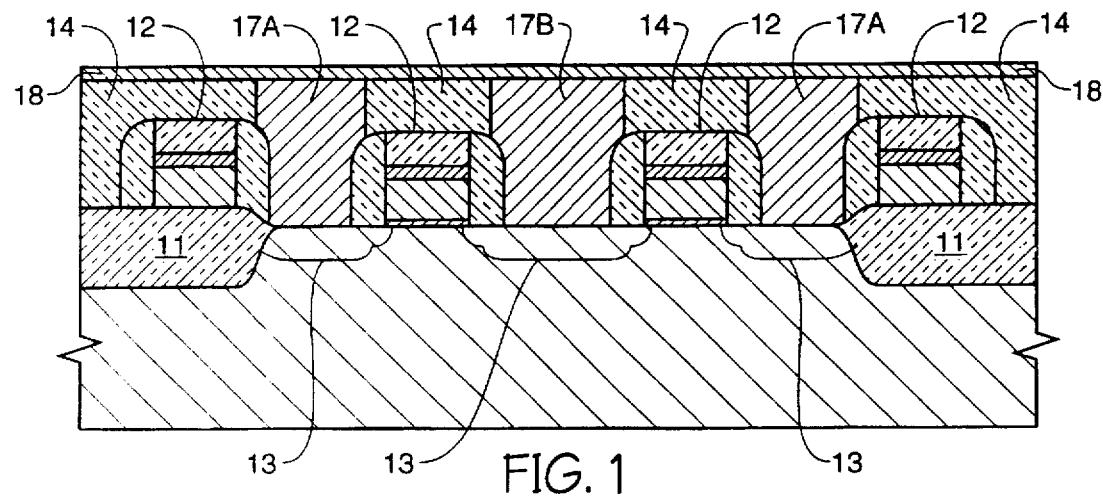
FIG. 1 is a cross-sectional view of a portion of an in-process DRAM array at a stage in the fabrication following field isolation region formation, wordline formation, and access transistor source/drain region formation, deposition of a planarizing dielectric layer, bitline contact and storage-node contact opening formation, formation of conductive plugs in both types of contact openings, and deposition of an etch stop layer.

This invention is a process for fabricating a dynamic random access memory (DRAM) capacitor. Referring now to FIG. 1, the process begins at a point in the DRAM manufacturing sequence that follows formation of field isolation regions 11, formation of wordlines 12, and formation of source/drain regions 13 for access transistors, the gates of which are provided by the wordlines 12. The process is facilitated by the deposition of a base dielectric layer 14, formation of storage-node contact openings 16A and bitline contact openings 16B in the base dielectric layer 14, and the filling of both types of openings with conductive material to form storage-node contact plugs 17A and bitline contact plugs 17B. Although polysilicon having the same dopant type as the junctions of the cell access transistor is considered to be the preferred material for the contact plugs (17A & 17B), a refractory metal such as tungsten can also be used if a barrier layer is placed between the junctions of the cell access transistor and the tungsten plugs. Following a chemical-mechanical polishing (CMP) step which planarizes the base dielectric layer so that the tops of the plugs (17A & 17B) are at approximately the same level as the upper surface of the base dielectric layer, an optional etch stop layer 18 is deposited on the upper surface of the array. A blanket resist deposition step, followed by a plasma etch bask step may be used to replace the chemical-mechanical polishing step. A silicon nitride layer or a ceramic material layer function well as etch stop layers. In an alternate, but more complex embodiment of the invention, the base dielectric layer is planarized with a CMP step or a photoresist coat/plasma etch back step first. An etch stop layer is then deposited, followed by the formation of contact openings and the deposition of conductive plug material. An additional CMP step or photoresist coat/plasma etch back step is then required to singulate the plugs.

Figure 2:
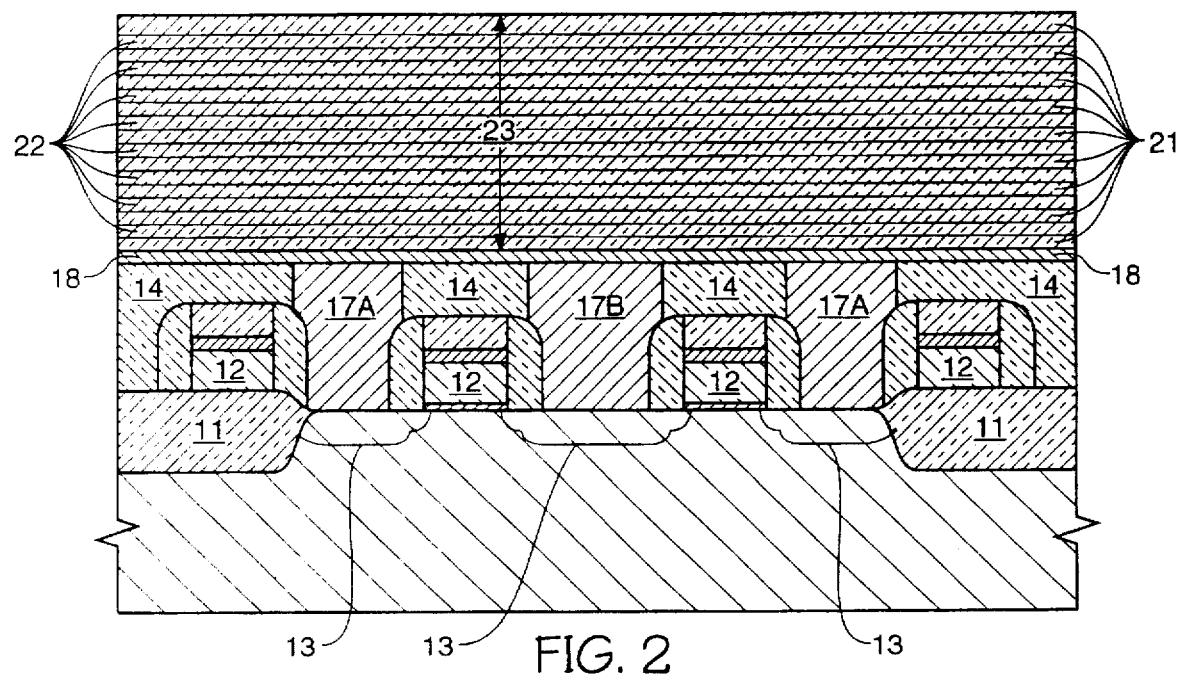
FIG. 2 is a cross-sectional view of the portion of the in-process DRAM array of FIG. 1 following the deposition of alternating layers of first material layers and second material layers on top of the array to form a single mold layer.

Referring now to FIG. 2, alternating first material layers 21 and second material layers 22 have been deposited on top of the in-process array of FIG. 1 to form a single sacrificial mold layer 23. A requirement of the invention is that the second material layers 21 be selectively etchable with respect to the first material layers 22, and that both the first and the second materials be selectively etchable with respect to polycrystalline silicon. This merely means that the second material can be etched significantly faster than the first material with a particular etchant and that the first and second materials can be etched significantly faster than polysilicon with a particular etchant. In a preferred embodiment of the invention, a plurality of oxide layers having alternately-varying composition are deposited using tetraethyl-ortho silicate (TEOS) as a precursor compound in a chemical vapor deposition process. Oxide deposited using this precursor is commonly referred to as TEOS oxide. In one embodiment of the invention, alternating layers of ozone TEOS oxide (an oxide of silicon deposited using TEOS as a precursor in an ozone ambient) and plasma-enhanced TEOS oxide are deposited in-situ (i.e., in the same deposition reactor system by alternately varying the reactants admitted to the reactor). In another embodiment of the invention, alternating layers of doped and undoped TEOS oxide are deposited. In yet another embodiment, alternating layers of BPSG and undoped silicate glass (USG) are deposited. In still another embodiment, alternating layers of boron-doped and phosphorus-doped silicate glass are deposited. In the first case, ozone TEOS oxide etches more rapidly than does plasma-enhanced TEOS oxide. In the second and third case, doped TEOS oxide and BPSG etch more rapidly than do the undoped varieties of the same materials. In the fourth case, boron-doped silicate glass etches more rapidly than does phosphorus-doped silicate glass. Any of the aforementioned oxides (or glasses) can be wet etched with respect to polycrystalline silicon.

Figure 3:
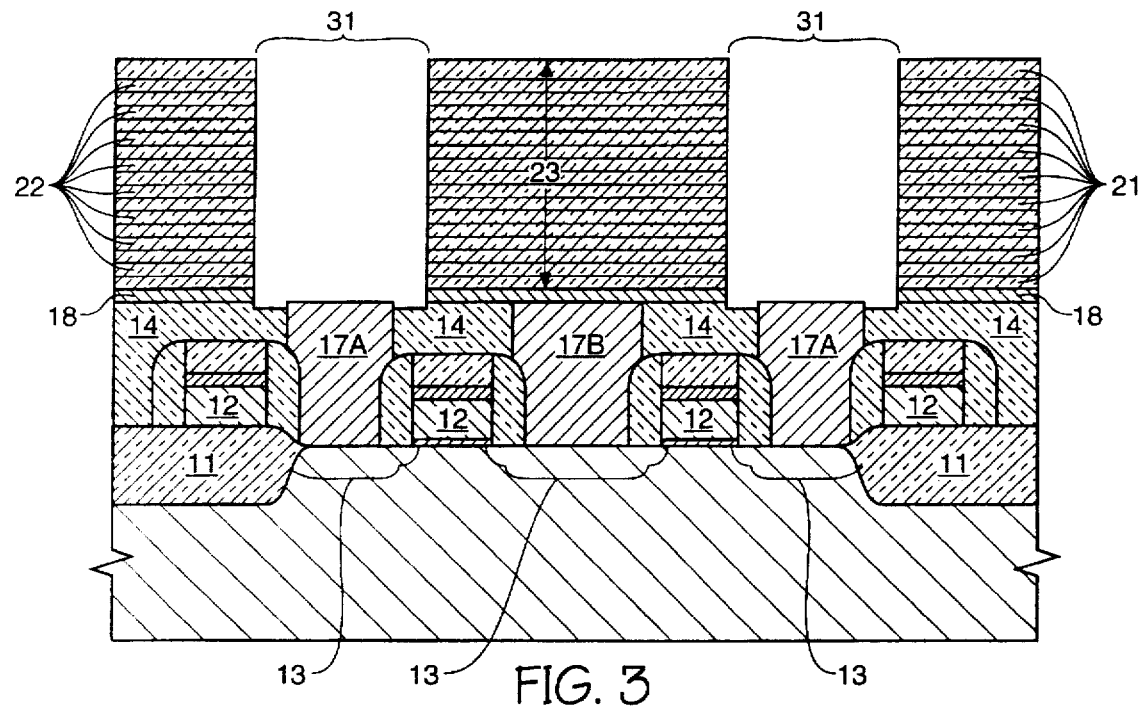
FIG. 3 is a cross-sectional view of the portion of the in-process DRAM array of FIG. 2 following the formation of mold openings in the mold layer.

Referring now to FIG. 3, following a masking step, mold openings 31 have been etched in the mold layer 23 using an anisotropic plasma etch. Each mold opening penetrates the mold layer 23 and the etch stop layer 18 so as to expose the top of each storage-node contact plug 17A. A certain amount of over etch is desirable to take into account process variation.

Figure 4:
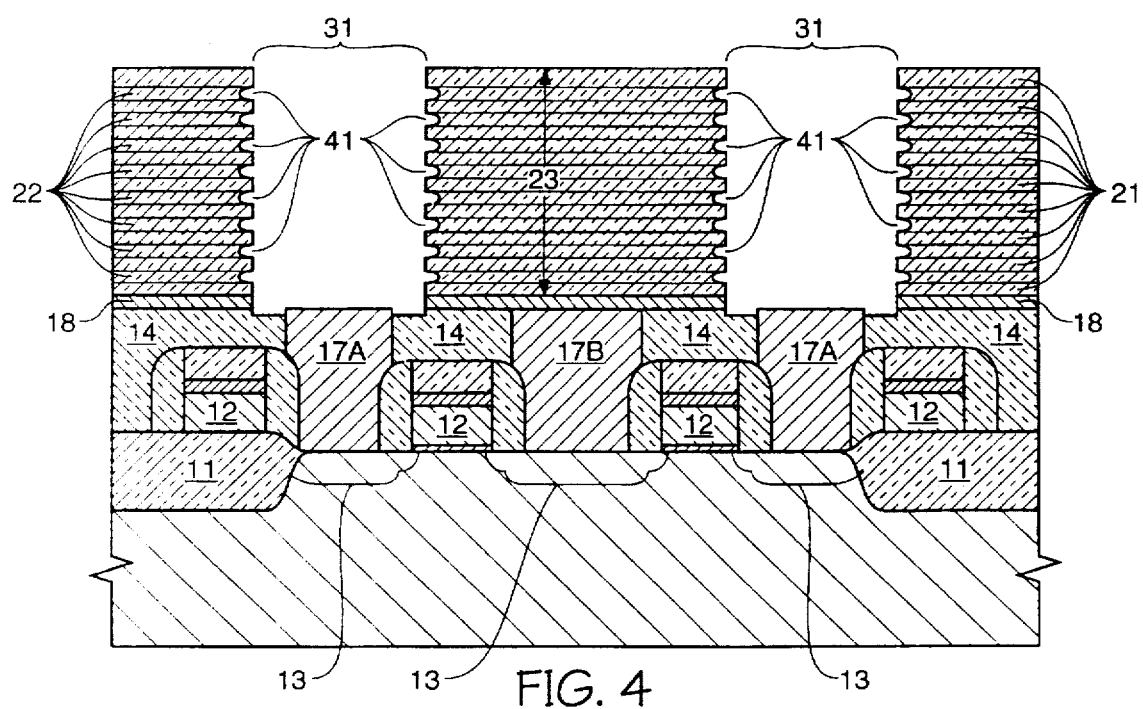
FIG. 4 is a cross-sectional view of the portion of the in-process DRAM array of FIG. 3 following a wet etch which selectively etches the first material layers with respect to the second material layers.

Referring now to FIG. 4, a wet etch step is employed which selectively etches the second material layers 22 at a faster rate than the first material layers 21. The selective etching creates a pattern of annular grooves 41 within each mold opening 31.

Figure 4A:
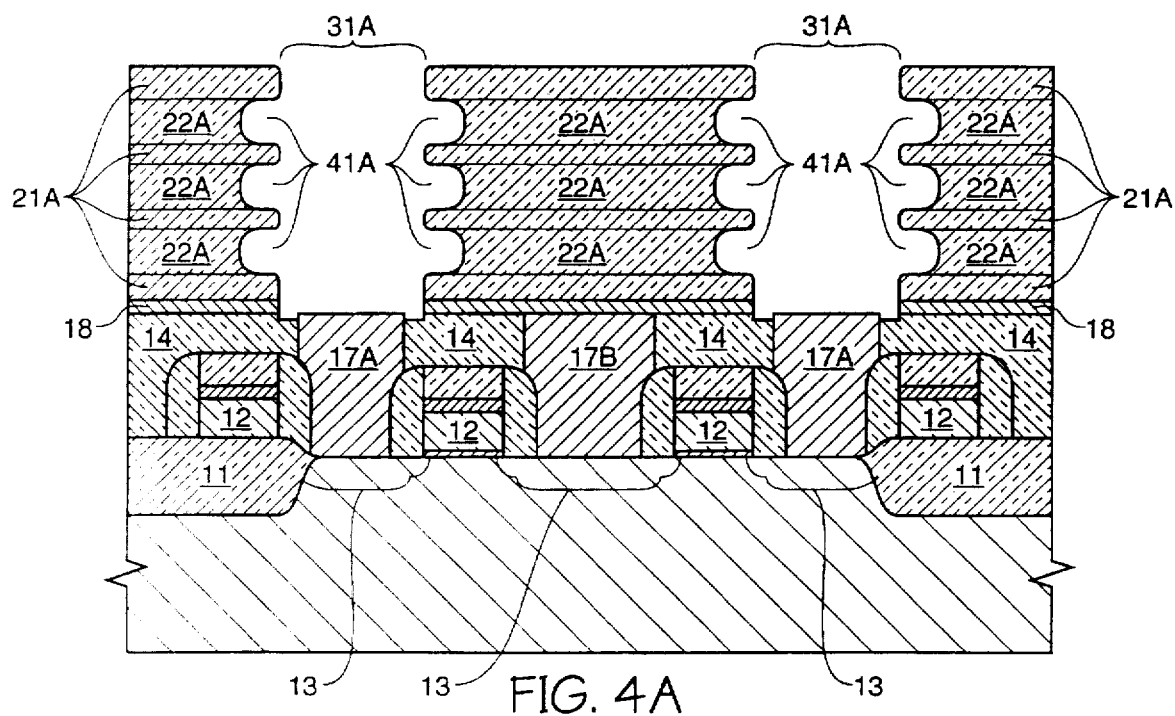
FIG. 4A is a cross-sectional view of a portion of an in-process DRAM array similar to that of FIG. 4, except that thicker and fewer first and second material layers have been used, and they have been subjected to a longer wet etch for the selective etching step.

FIG. 4A depicts an alternative embodiment of the process. Although the mold layer of this embodiment is similar to that of FIG. 4, it has fewer first and second material layers, and they have been subjected to a longer wet etch for the selective etching step in order to form a pattern of annular grooves 41A. In addition, it will be noted that the second material layers 22A (those that etch the most rapidly) are considerably thicker than the first material layers 21A. This feature provides, as will be subsequently seen, a cell capacitor having maximum surface area and, thus, maximum capacitance.

Figure 5:
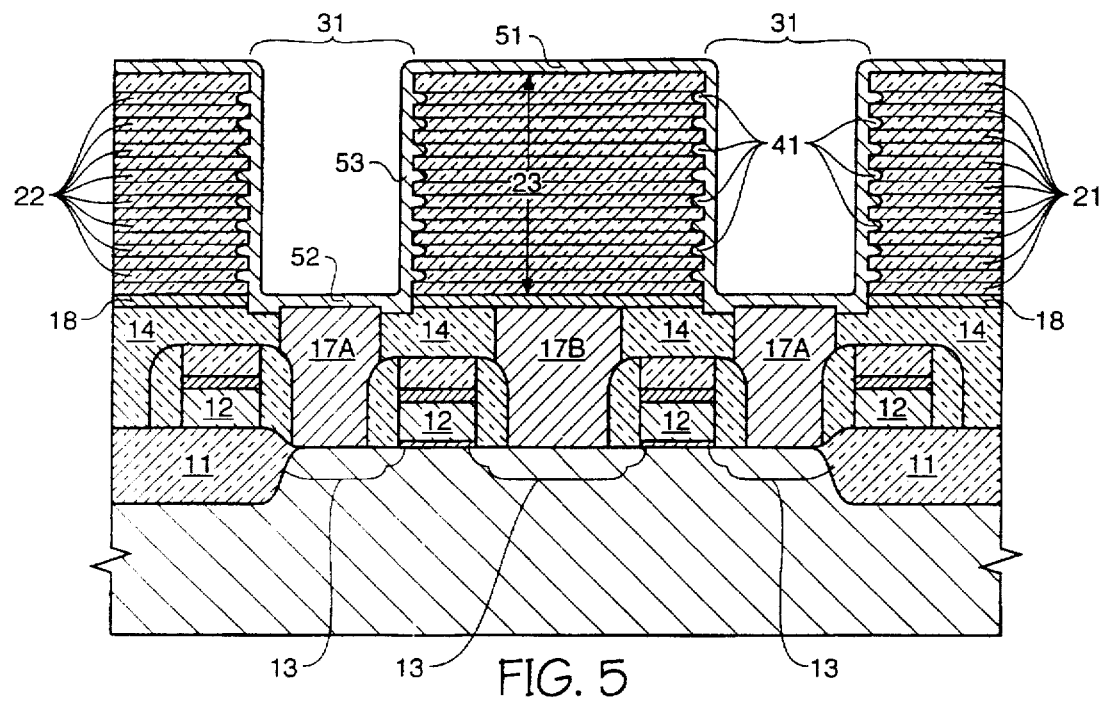
FIG. 5 is a cross-sectional view of the portion of the in-process DRAM array of FIG. 4 following the deposition of a polycrystalline silicon layer.

Referring now to FIG. 5, a storage-node plate layer 51 has been blanket deposited over the array depicted in FIG. 4. Although exotic materials such as platinum and titanium nitride have been suggested for use as a storage-node plate layer, for the currently-preferred embodiment of the invention, the storage-node plate layer 51 is doped polycrystalline silicon deposited using chemical vapor deposition (CVD). It will be noted that the storage-node plate layer 51 has covered the upper surface of the mold layer 23 and the interior of the mold openings 31. Because CVD typically forms deposited layers which conform well to irregularly-shaped surfaces and which display excellent step coverage, the grooves within mold openings 31 are conformally coated with polysilicon layer 51. It will be noted that the annular grooves 41 (see FIG. 4) within mold openings 31 are narrow in relation to the thickness of storage-node plate layer 51. Thus, the exposed surface of storage-node plate layer 51 is smooth.

Figure 5A:
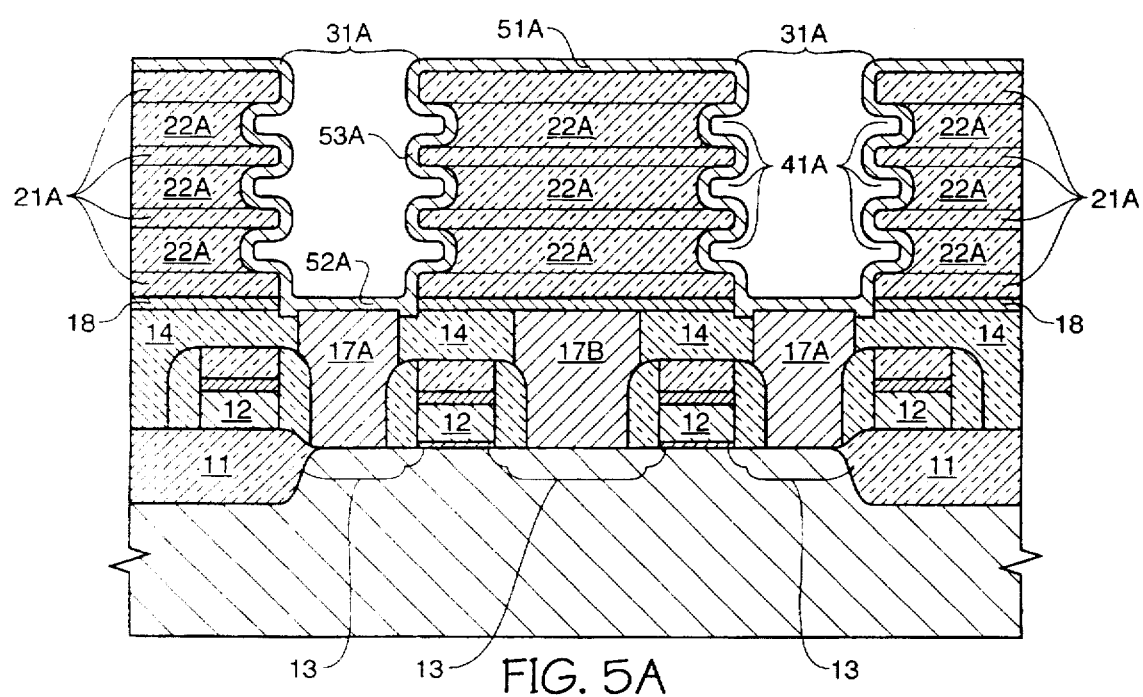
FIG. 5A is a cross-sectional view of the portion of the in-process DRAM array of FIG. 4A following the deposition of a polycrystalline silicon layer.

Referring now to FIG. 5A, a storage-node plate layer 51A has been blanket deposited over the array depicted in FIG. 4. In a preferred embodiment of the invention storage-node plate layer 51A is doped polycrystalline silicon deposited using chemical vapor deposition (CVD). It will be noted that the annular grooves 41A (see FIG. 4A) within mold openings 31A are spaced such that the polysilicon layer 51A forms a cup-shaped depression having a floor portion 52A and a wall portion 53A, with the wall portion of the cup having a bellows-like structure, rather than merely filling the grooves 41 of FIG. 4.

Figure 6:
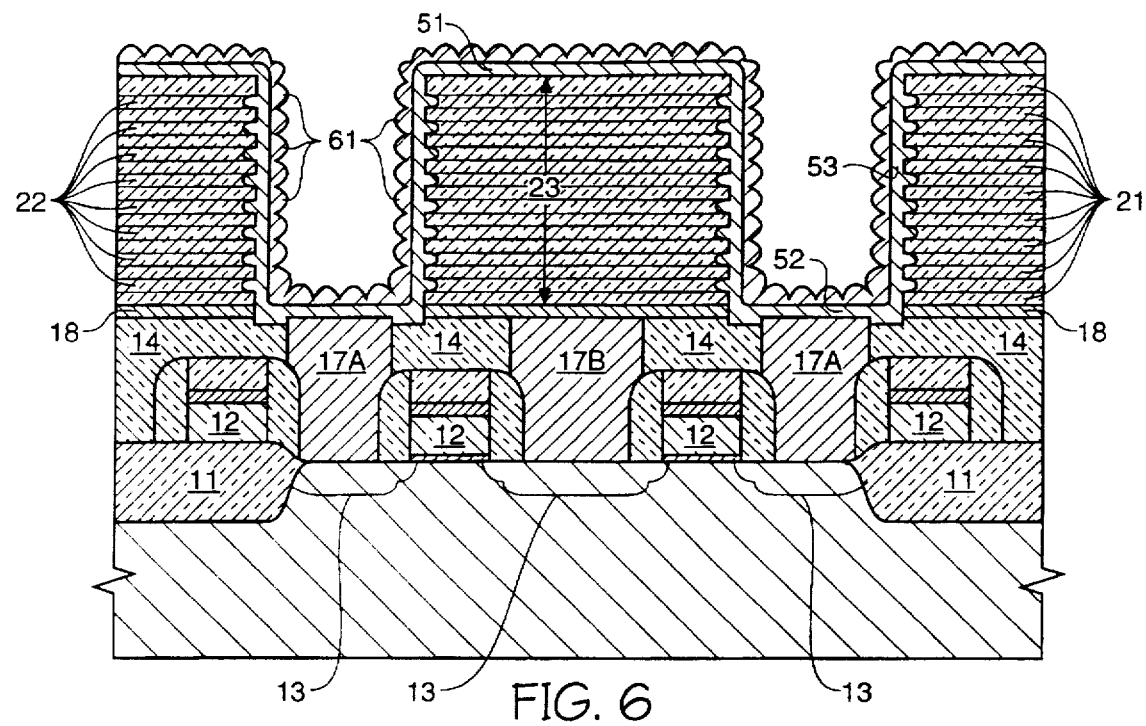
FIG. 6 is a cross-sectional view of the portion of the in-process DRAM array of FIG. 5 following the deposition of hemispherical grain polysilicon protuberances on the exposed surface of the polycrystalline silicon layer.

Referring now to FIG. 6, an optional rough capacitance-enhancing surface has been formed on the exposed surface of polysilicon layer 51 through the formation of hemispherical grain polysilicon protuberances 61 thereon.

Figure 7:
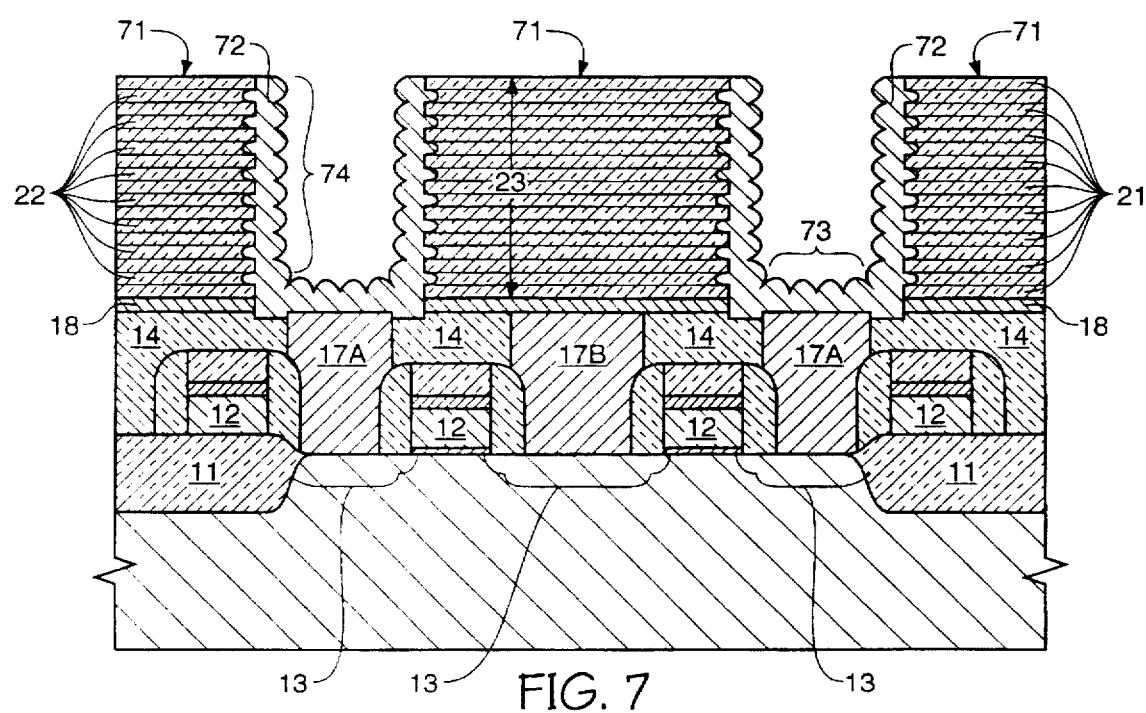
FIG. 7 is a cross-sectional view of the portion of the in-process DRAM array of FIG. 6 following removal of the that portion of the polycrystalline silicon layer that is on the upper surface of the mold layer.

Referring now to FIG. 7, that portion of the polycrystalline silicon layer 51 that is on the upper surface 71 of the mold layer 23 has been removed. This may be accomplished in a number of ways without the use of an additional mask required by the prior art. Two preferred ways are with a chemical-mechanical polishing step or with a resist coating followed by a plasma etch. The removal of the polysilicon on the upper surface of the mold layer 23 singulates the storage-node plates within the array. The pair of storage-node plates 72 that are shown in FIG. 7 are cup-shaped, and have a floor portion 73 and a vertically-oriented wall portion 74.

Figure 8:
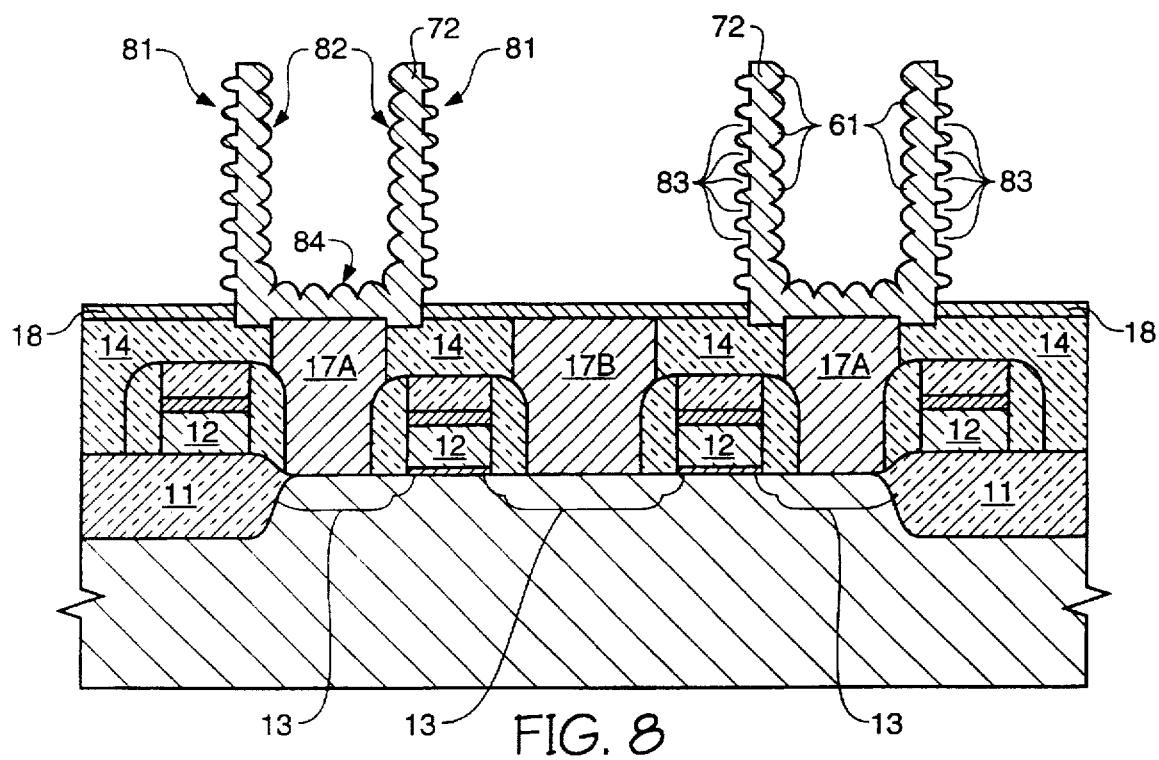
FIG. 8 is a cross-sectional view of the portion of the in-process DRAM array of FIG. 7 following removal of mold layer remnants.

Referring now to FIG. 8, the remaining portion of mold layer 23 has been removed. In the case where both first and second material layers (21 & 21) are both various forms of TEOS oxide, a single wet silicon dioxide etch is employed. A plasma etch, although generally less selective than certain wet etches, may also be employed to remove the mold layer 23. It will be noted that the wall portion 74 of each storage-node plate 72 has an outer perimetric surface 81 on wall portion 74 (see FIG. 7) and an inner perimetric surface 82 on wall portion 74 (see FIG. 7). The outer surface 81 has a plurality of perimetric grooves 83 which are stacked one on top of another. Charge will be stored on the upper surface 84 of each floor portion 73 (see FIG. 7), on the outer surface 81, and on the inner surface 82. The grooves 83 enhance the charge storing capacity of the outer surface 81, while the hemispherical-grain polysilicon protuberances 61 on the inner surface 82 enhance the charge storing capacity of the inner surface 82.

Figure 9:
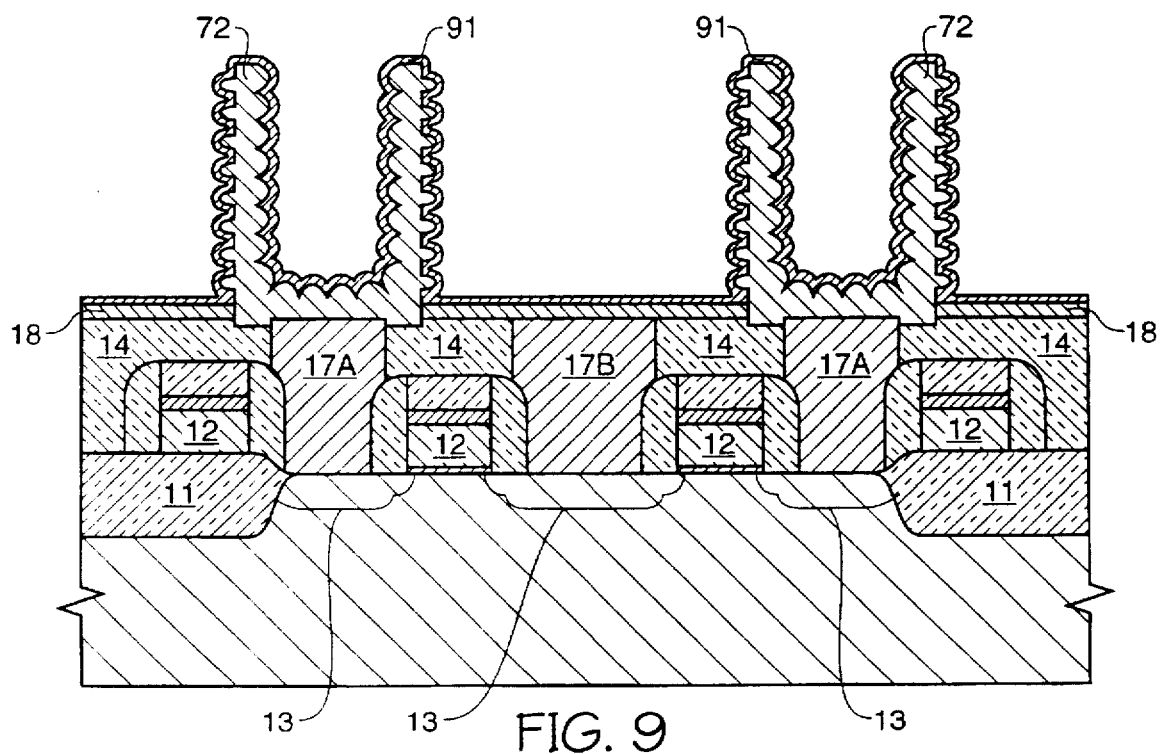
FIG. 9 is a cross-sectional view of the portion of the in-process DRAM array of FIG. 8 following the deposition of a capacitor dielectric layer.

Referring now to FIG. 9, completion of the capacitors may now take place in either a conventional or unconventional manner. The first step in the completion of the capacitor is the deposition of a capacitor dielectric layer 91 that is compatible with the material from which the storage-node plates 71 are fabricated. Although conventional DRAM technology employs oxide-nitride-oxide as the capacitor dielectric layer, other types of dielectric materials have been either used or suggested.

Figure 10:
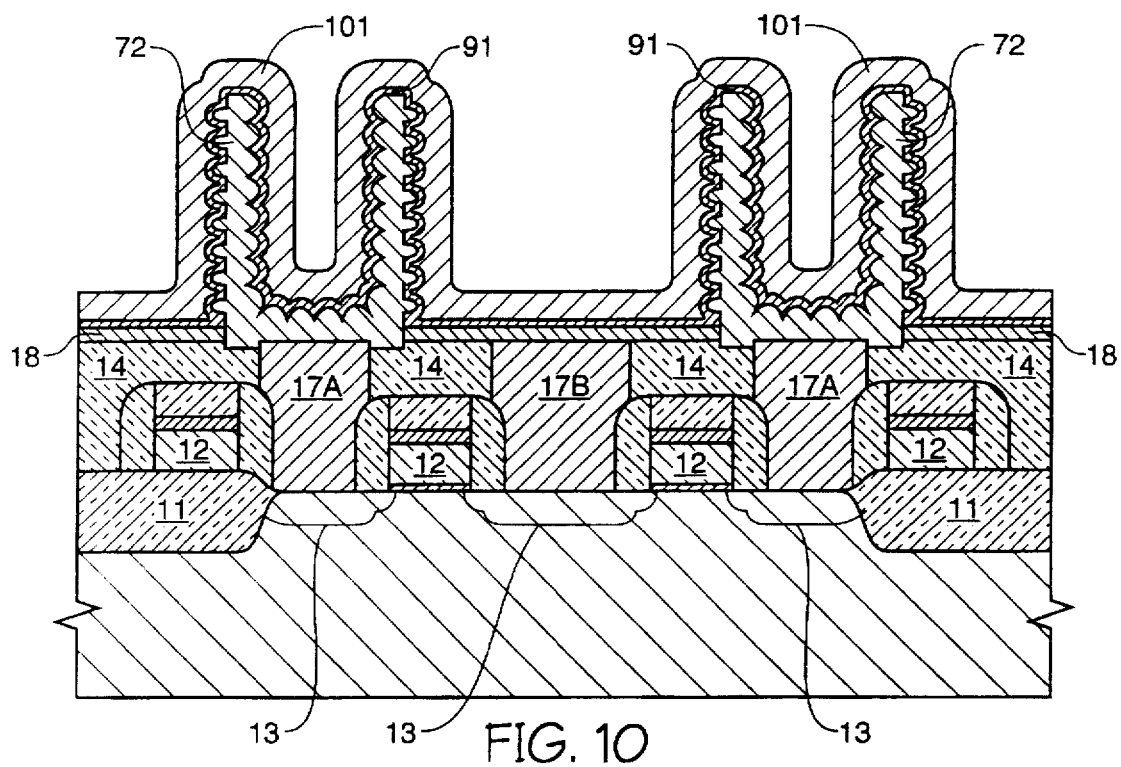
FIG. 10 is a cross-sectional view of the portion of the in-process DRAM array of FIG. 9 following the deposition of a cell plate layer.
Figure 10A:
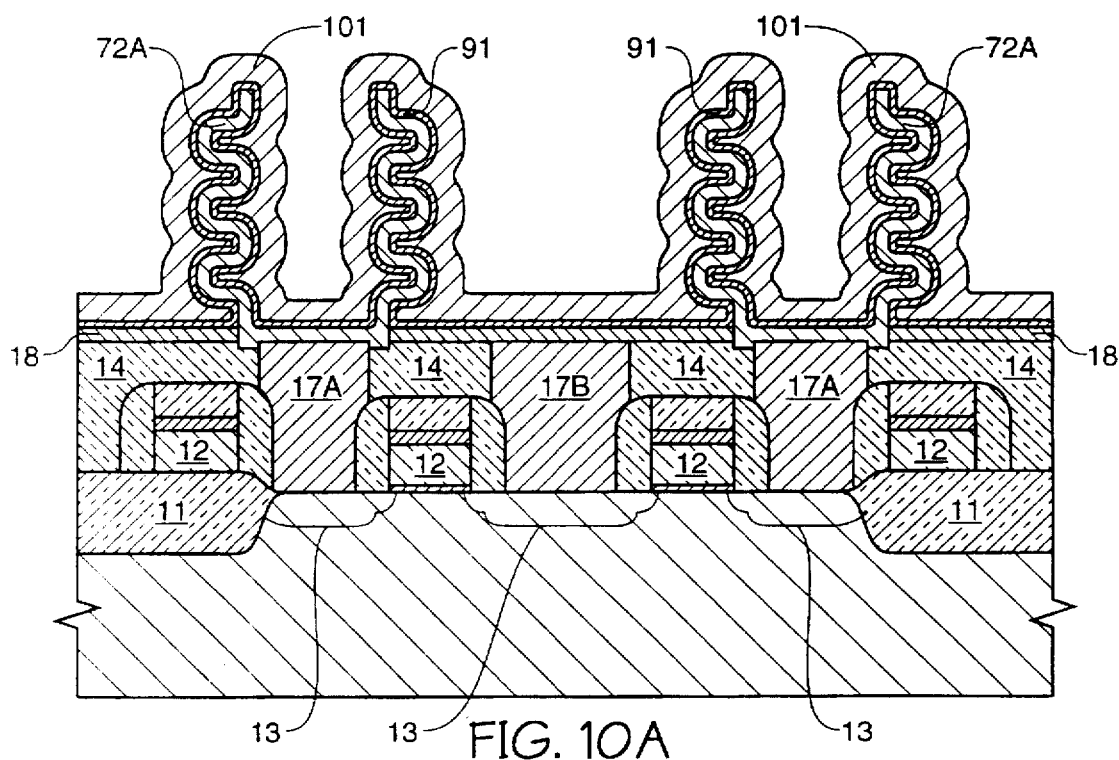
FIG. 10A is a cross-sectional view of the portion of the in-process DRAM array of FIG. 5A following removal of the that portion of the polycrystalline silicon layer that is on the upper surface of the mold layer, removal of mold layer remnants, deposition of a capacitor dielectric layer, and deposition of a cell plate layer.

Referring now to FIG. 10, the cell capacitors are completed with the deposition of a cell plate layer 101. This may be a doped polysilicon layer or it may be some other conductive material that is compatible with the capacitor dielectric layer 91.

It should be noted that a structure similar to that depicted in FIG. 10 will result from the completion of the unfinished capacitor depicted in FIG. 5A. The storage-node plate of the capacitor so completed will have a floor portion and a vertically-oriented, bellows-shaped wall portion. Charge will be stored on both the inner and outer surfaces of the bellows-like structure, as well as on a floor portion of the storage-node plate.

Figure 11:
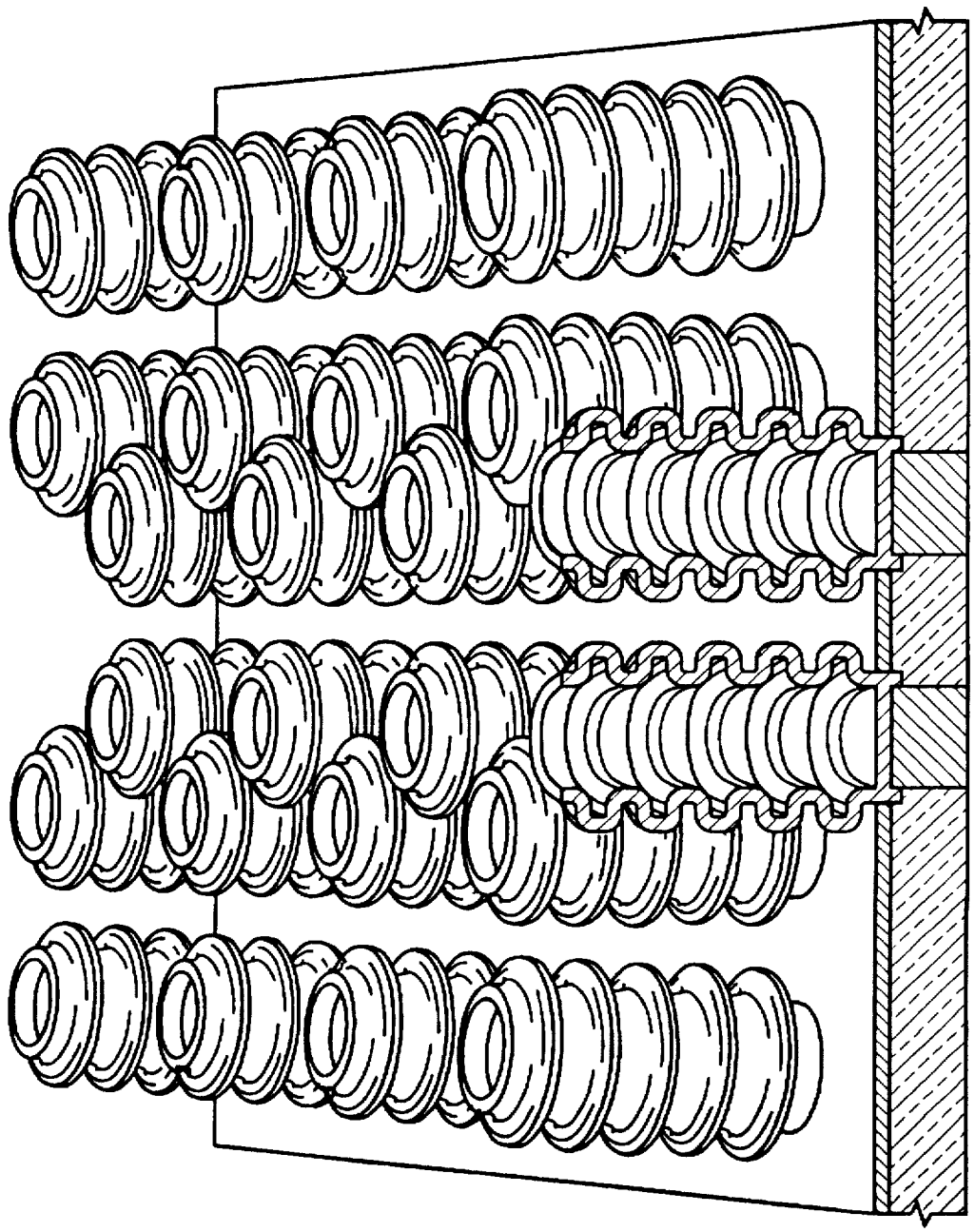
FIG. 11 is a photograph taken with a scanning electron microscope showing capacitor storage-node plates fabricated using the herein-described process.

Referring now to the FIG. 11 photograph, a plurality of storage--node plates are shown in a combination of both cross-sectional views (foreground) and perspective views (background). At this stage of fabrication, there has been no deposition of hemispherical grain polysilicon protuberances, no deposition of a capacitor dielectric layer, nor deposition of a cell plate layer. As can be seen from the dimension scale superimposed on the photograph, these structures are of a size that is appropriate for use in a 256-megabit dynamic random access memory.

Although only several embodiments of the new process has been disclosed herein, it will be obvious to those having ordinary skill in the art that modification and changes may be made thereto without departing from the spirit and the scope of the process as hereinafter claimed. For example, a trivial change is the reversal of the order of deposition of the first and second material layers. In the existing drawing figures, the most rapidly etched material was deposited second. This can be reversed with similar results. This reversal is intended to be covered by the scope of the existing claims.

ADVANTAGES OF THE INVENTION

The process of the present invention is advantageous over the prior art for a number of reasons. A cup-shaped storagenode plate which stores charge on inner and outer surfaces and which has annular grooves for increased capacitance is product of the process. The process is advantageous because a stratified sacrificial mold layer is produced in situ. Additionally, no mask is required to singulate individual storage-node capacitor plates from the storage-node plate layer. Furthermore, a single wet etch is employed to remove the sacrificial mold layer.

We claim:

1. A process for fabricating cell capacitors for a dynamic random access memory array on a silicon substrate, said process commencing at a stage of the memory fabrication sequence that follows formation of field isolation regions, wordlines, and access transistor source/drain regions, said process comprising the following steps:

(a) depositing a base dielectric layer, said base dielectric layer covering said substrate and all heretofore enumerated structures;

(b) forming storage-node contact openings in the base dielectric layer which expose one of two source/drain regions associated with each access transistor;

(c) forming a conductive plug within each storage-node contact opening;

(d) depositing alternating layers of first and second materials on top of the base dielectric layer and the conductive plugs, said alternating layers constituting a single mold layer, said second material being selectively etchable with respect to said first material, and both said first and second materials being selectively and simultaneously etchable with respect to polycrystalline silicon;

(e) forming mold openings within said mold layer, each mold opening exposing at least an upper surface of a single conductive plug;

(f) subjecting the mold layer to an etch which selectively etches said first material layers with respect to said second material layers within the mold openings;

(g) depositing a polycrystalline silicon layer which covers an upper surface of the mold layer and also lines the mold openings;

(h) removing portions of the polycrystalline silicon layer from the upper surface of the mold layer, a remaining portion of the polycrystalline silicon layer within each mold opening thus becoming an individual storage-node capacitor plate;

(i) etching away a remaining portion of the mold layer so as to expose an outer surface of each storage-node plate;

(j) depositing a capacitor dielectric layer, said capacitor dielectric layer covering all exposed portions of each storage-node capacitor plate; and (k) depositing a cell plate layer on top of the capacitor dielectric layer.

2. The process of claim 1, which further comprises the step of depositing an etch stop layer between the base dielectric layer and the mold layer.

3. The process of claim 1, wherein an entire remaining portion of the mold layer is etched away.

4. The process of claim 1, which further comprises the step of forming a conductive barrier layer on top of each conductive plug between step (d) and step (e).

5. The process of claim 1, wherein said first and second materials both comprise Primarily silicon dioxide.

6. The process of claim 5, wherein both silicon dioxide layers are deposited using a single chemical vapor deposition reactor.

7. The process of claim 5, wherein said first material is ozone TEOS silicon dioxide, and said second material is plasma-enhanced TEOS silicon dioxide.

8. The process of claim 1, wherein said first material is undoped silicate glass and said second material is boro-phospho-silicate glass.

9. The process of claim 1, which further comprises the step of forming hemispherical grain polysilicon protuberances on an exposed surface of the polycrystalline silicon layer.

10. A process for fabricating cell capacitors within an in-process dynamic random access memory array, said in-process array having an access transistor for each cell within the array, each transistor having first and second source/drain regions formed in a silicon substrate, said first source/drain region intended to function as an access-node junction for bitline contact, and said second source/drain region intended to function as a storage-node junction for electrical contact to one plate of a cell capacitor, said process comprising the steps of:

(a) depositing alternating layers of first and second materials on top of the in-process array, said alternating layers constituting a single mold layer, said second material being selectively etchable with respect to said first material, and both first and second materials being selectively and simultaneously etchable with respect to polycrystalline silicon;

(b) forming a mold opening within said mold layer superjacent each second source/drain region within the array;

(c) providing, at the bottom of each mold opening, means for making electrical contact to the subjacent storage-node junction;

(d) subjecting the mold layer to an etch step which selectively etches said first material layers with respect to said second material layers within each mold opening;

(e) depositing a polycrystalline silicon layer which covers an upper surface of the mold layer and also lines each mold opening;

(f) removing the polycrystalline silicon from an upper surface of the mold layer to form a storage-node capacitor plate within each mold opening;

(g) removing a remaining portion of the mold layer so as to expose an outer surface of each storage-node plate;

(h) depositing a capacitor dielectric layer which completely covers all exposed surfaces of each storage-node capacitor plate; and (i) covering the capacitor dielectric layer with a cell plate layer.

11. The process of claim 10, wherein first and second materials both comprise primarily oxides of silicon.

12. The process of claim 11, wherein both first and second material layers are deposited in-situ using a single CVD reactor.

13. The process of claim 10, wherein the provision of means for making electrical contact to the storage-node junction below each mold opening includes the step of fabricating a conductive plug at each mold opening location, said plug providing electrical contact between a storage-node plate and its subjacent storage-node junction.

14. The process of claim 10, wherein the provision of means for making electrical contact to the storage-node junction at the bottom of each mold opening includes the step of etching the mold opening to a depth sufficient to expose the storage-node contact.

15. A process for fabricating a storage-node plate for the capacitor of a dynamic random access memory cell, said cell having an access transistor, said transistor having first and second source/drain regions formed in a silicon substrate, the first region destined to be electrically coupled to a bitline, and the second region destined to be electrically coupled to the storage-node plate, said process comprising the steps of:

(a) depositing alternating layers of first and second materials superjacent the substrate, said alternating layers constituting a single mold layer, said second material being selectively etchable with respect to said first material, and both first and second materials being selectively and simultaneously etchable with respect to polycrystalline silicon;

(b) forming a mold opening within said mold layer directly above the second region;

(c) providing means for making electrical contact to the first region at the bottom of the mold opening;

(d) subjecting the mold layer to a single etch step which selectively etches said first material layers with respect to said second material layers within each mold opening;

(e) depositing a polycrystalline silicon layer which covers an upper surface of the mold layer and also completely lines each mold opening;

(f) removing portions of the polycrystalline silicon which cover from the upper surface of the mold layer; and (g) etching away a remaining portion of the mold layer.

16. The process of claim 15, wherein said mold opening is formed by etching downwardly through the mold layer with a plasma etch.

17. The process of claim 16, wherein the plasma etch is anisotropic.

18. The process of claim 16, wherein the plasma etch is predominantly anisotropic.

19. The process of claim 15, wherein first and second materials are both oxides of silicon which are deposited using chemical vapor deposition (CVD) and tetra-ethyl-ortho-silicate (TEOS) as a precursor compound.

20. The process of claim 15, wherein said first material is ozone TEOS silicon oxide, and said second material is plasma-enhanced TEOS silicon dioxide.

* * * * *